(12) United States Patent
Weilermann et al.

(10) Patent No.: US 7,950,347 B2
(45) Date of Patent: May 31, 2011

(54) ROTATABLE DEVICE FOR HOLDING A SUBSTRATE

(75) Inventors: Katrin Weilermann, Garching (DE); Karl-Josef Kramer, Garching (DE)

(73) Assignee: Suss Microtec Lithography, GmbH, Garching (DE)

( * ) Notice: Subject to any disclaimer, the term of this patent is extended or adjusted under 35 U.S.C. 154(b) by 538 days.

(21) Appl. No.: 11/718,572

(22) PCT Filed: Nov. 3, 2005

(86) PCT No.: PCT/EP2005/011776
§ 371 (c)(1),
(2), (4) Date: Sep. 12, 2008

(87) PCT Pub. No.: WO2006/048287
PCT Pub. Date: May 11, 2006

(65) Prior Publication Data
US 2009/0000544 A1    Jan. 1, 2009

(30) Foreign Application Priority Data
Nov. 3, 2004   (DE) .................. 10 2004 053 139

(51) Int. Cl.
*B05C 13/00* (2006.01)
*B05C 11/02* (2006.01)
*B05B 13/02* (2006.01)

(52) U.S. Cl. ............ 118/500; 118/58; 118/52; 118/612; 118/319; 118/320

(58) Field of Classification Search ............. 118/52, 118/612, 318–319, 56, 500, 58, 59, 320; 427/240; 134/153, 198, 902; 396/604, 611, 396/627
See application file for complete search history.

(56) References Cited

U.S. PATENT DOCUMENTS

| | | | |
|---|---|---|---|
| 5,349,978 | A | 9/1994 | Sago et al. |
| 5,580,607 | A | 12/1996 | Takekuma et al. |
| 6,284,044 | B1 * | 9/2001 | Sakamoto et al. ............ 118/219 |
| 2002/0152958 | A1 * | 10/2002 | Shigemori et al. ............ 118/663 |

FOREIGN PATENT DOCUMENTS

| | | |
|---|---|---|
| JP | 64015925 | 1/1989 |
| JP | 02133475 | 11/1990 |
| JP | 03230518 | 10/1991 |
| JP | 03-230518 | 1/1992 |
| JP | 04354560 | 12/1992 |

(Continued)

OTHER PUBLICATIONS

Japanese Office Action Mailing Date Aug. 3, 2010. Concise Explanation of Relevance of JP02133475.

*Primary Examiner* — Yewebdar T Tadesse
(74) *Attorney, Agent, or Firm* — AKC Patents LLC; Aliki K. Collins

(57) ABSTRACT

The invention provides a rotatable and optionally heatable device for holding a flat substrate. The device includes a supporting means for placing and holding the substrate on a supporting surface, optionally a heater, a means for rotating the supporting means and a means for applying a fluid, e.g. a solvent, onto the side of the substrate facing the supporting surface. The fluid is applied when the supporting device for supporting and holding the substrate is caused to rotate.

18 Claims, 3 Drawing Sheets

FOREIGN PATENT DOCUMENTS

Figure 1:
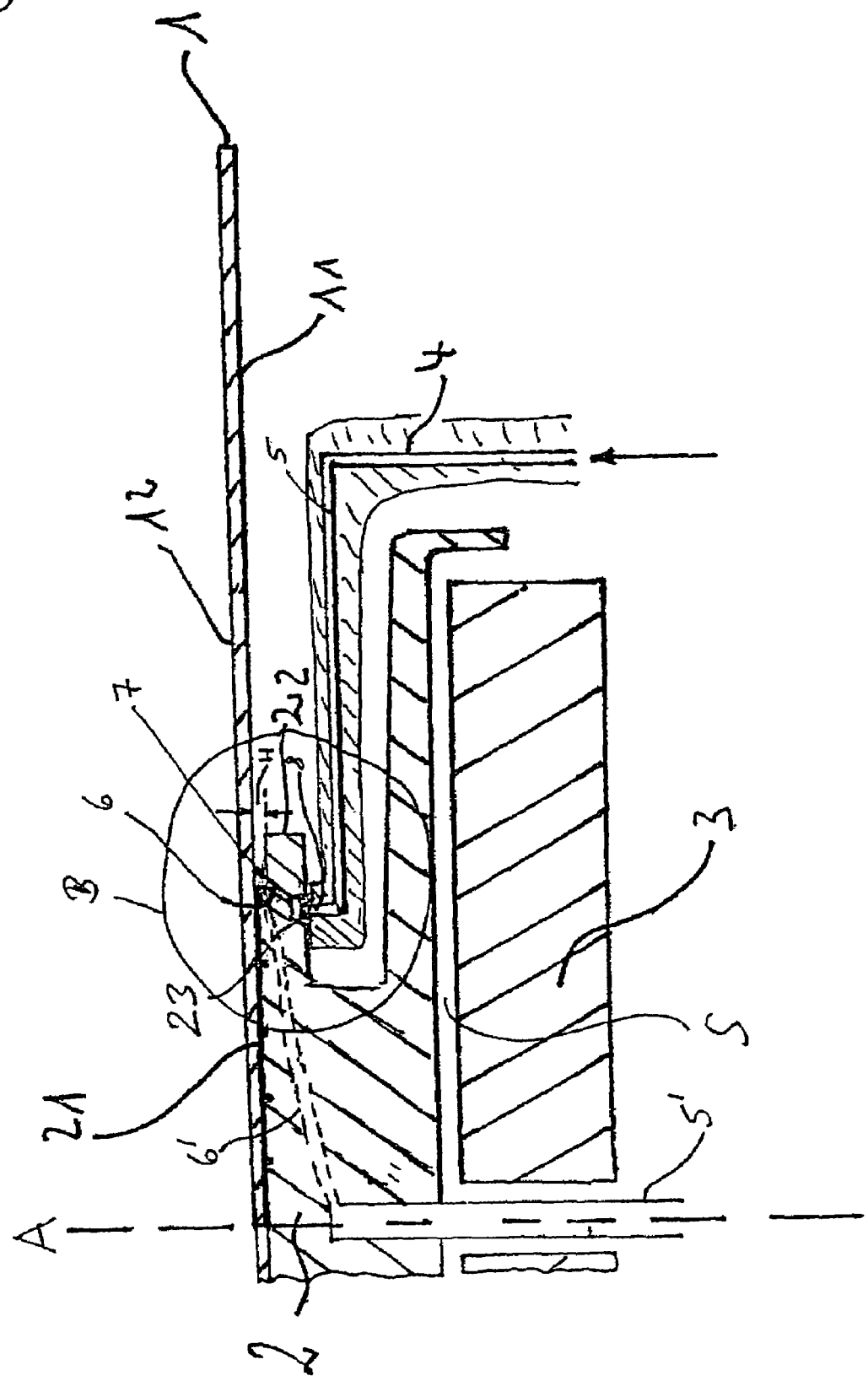

| | | |
|---|---|---|
| JP | 06216018 | 8/1994 |
| JP | 06-210618 | 11/1994 |
| JP | 06224113 | 12/1994 |
| JP | 08051064 | 2/1996 |
| JP | 08139007 | 5/1996 |
| JP | 2004-087934 | 12/2003 |
| JP | 2004087934 | 3/2004 |

* cited by examiner

Fig. 3
(a)
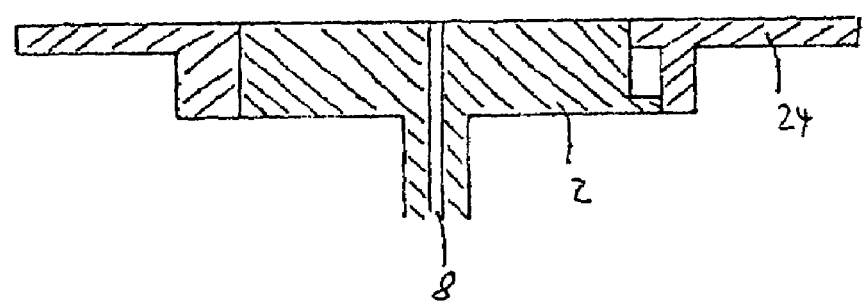
(b)
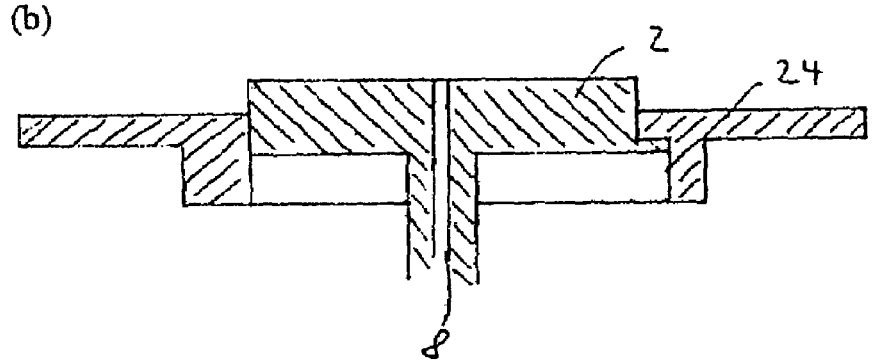
(c)
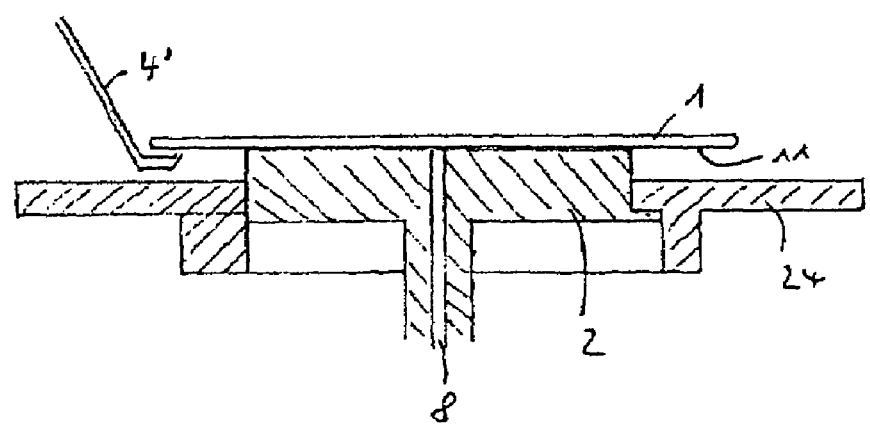

ROTATABLE DEVICE FOR HOLDING A SUBSTRATE

This application is the National Stage of International Application No. PCT/EP2005/011776, International Filing Date, 3 Nov. 2005, which designated the United States of America, and which international application was published under PCT Article 21(2) as WO Publication No. WO 2006/048287 A1 and which claims priority from German Application No. 10 2004 053 139.0, filed 3 Nov. 2004.

The disclosed embodiments relate to a rotatable and optionally heatable device or a chuck for holding a substrate.

In the production of semiconductor elements or in the production of optical data carriers, so-called chucks are normally used for holding or fixing flat substrates. Chucks of this kind have a supporting surface for the substrates on which the substrate is sucked and retained by means of specifically arranged vacuum channels. For heating the substrate it is known to heat the chuck and thus the substrate resting on the chuck by means of a heater. An application in which heatable chucks are used is the surface coating of substrates by spray coating, as used in the production of semiconductors or optical data carriers. In spray coating, the substrate is heated to improve the edge covering.

Since the supporting surface of the chuck that is in direct contact with the substrate surface is normally smaller than the surface of the substrate, there is the risk that during the treatment of the substrate resting on the supporting surface of the substrate, the surface of the substrate facing the supporting surface of the chuck and projecting radially outwardly is contaminated. In spray coating, for instance a part of the lacquer or varnish to be applied to the side of the substrate facing away from the supporting surface reaches, via the outer edge, the back side, i.e. the side of the substrate which projects radially outwardly from the chuck, is exposed and faces the supporting surface. For removing such contaminations, the contaminated surface of the substrate is cleaned after the above-mentioned treatment (e.g. spray coating), for instance treated by means of a solvent. This is done in a system provided only for this purpose. For being able to clean the entire contaminated surface of the wafer, in particular also remove contaminations in the edge region of the substrate, either a nozzle, which applies the solvent to the waver, must be guided across the entire contaminated surface of the substrate while the wafer rests statically on a chuck provided for this purpose; alternatively, the wafer can be held, rotated and sprayed by a stationary nozzle in this cleaning step. Due to the rotation of the substrate, the solvent also reaches the edge region of the substrate.

In the known method, the respective treatment of the substrate, e.g. coating by spray coating carried out with or without heating the substrate and the necessary cleaning process are subsequently carried out on independent devices. However, this means that the substrate must be transported to a different device after the treatment, for example after coating by spray coating. Thus, there is the risk of a further contamination of or damage to the substrate. Moreover, this conventional method is time consuming and thus cost-intensive. Moreover, further costs are caused because two separate treatment devices are necessary.

It would be advantageous to provide an improved holding device for substrates which solves the above-mentioned problems. In particular, a holding device is provided which allows a treatment of a substrate resting on a holding surface and also the cleaning that is subsequently optionally necessary.

This can be achieved with the features of the claims.

The disclosed embodiments start out from the basic idea to treat, in particular clean the substrate resting on the rotatable holding device on its side facing the supporting surface of the holding device by means of a fluid applied to this side.

Moreover, the invention provides a holding device for flat substrates which is both heatable and rotatable in order to cause the substrates to rotate during the treatment.

The device of the claimed invention comprises a supporting means for placing and holding the flat substrate on a supporting surface. As described above, this can be done, e.g., by vacuum channels in the supporting surface by means of which the substrate is sucked and thus held in place. The device of the invention preferably comprises a means for heating the substrate. For the heating process, this heater is brought in contact with the back side of the supporting surface on which the substrate rests so as to be able to heat the substrate due to the contact between the heated supporting surface and the substrate. Moreover, the device of the invention comprises a means for rotating the holding means. In order to be able to rotate the holding and supporting means independently of the heater, for the rotation the supporting surface is separated from the heater, e.g., by an axial displacement. Heating of the supporting means by the heater and rotation of the substrate thus do not take place simultaneously.

During the rotation of the supporting means comprising the substrate, a fluid supply arrangement applies a fluid, e.g. a solvent, to the side of the substrate facing the supporting surface of the supporting means. The fluid or solvent is distributed due to the rotation and thus also reaches the edge region of the substrate.

The fluid or solvent is preferably supplied through a nozzle into a groove in the supporting means which is coaxial with respect to the rotational axis of the device; via a channel system, this groove is in contact with bores and openings in the edge region of the supporting means so that the fluid can be distributed onto the substrate against the side of the substrate radially projecting from the supporting surface and facing the supporting surface. To this end, the edge region of the supporting surface in which the openings are arranged is preferably slightly lowered. Alternatively, the fluid supply arrangement can also be configured as an external spray head. If necessary, said spray head can be moved below the edge region of the substrate so as to distribute the fluid or solvent onto the substrate on the side of the substrate projecting radially from the supporting surface and facing the supporting surface.

For holding a six inch substrate, the supporting surface has a diameter of typically approximately 143 mm. A radially following edge region of approximately 5 mm is lowered by approximately 0.2 mm. This edge region comprises the openings of the bores for spraying the solvent onto a circle having a diameter of, e.g., approximately 144 mm. The supporting means for placing and holding the substrate is preferably made of a metal or a metal alloy and particularly preferably of aluminum.

In order to additionally protect the side of the substrate facing the supporting surface of the supporting means during spray coating, the supporting means can be configured such that the substrate rests completely on the supporting surface during spray coating. To this end, an edge region being flush with the central region is provided in addition to the central region of the supporting means. For being able to remove spraying lacquer, which has possibly nevertheless deposited in the edge region on the side of the substrate facing the supporting surface, from the edge region of the substrate, the central region of the supporting means is coaxially movable or displaceable relative to the edge region so that in the displaced state also the side facing the supporting means is exposed in the edge region of the substrate. For cleaning the side of the substrate facing the supporting surface, a fluid or solvent is sprayed by means of a fluid supply arrangement, as described above.

Figure 2:
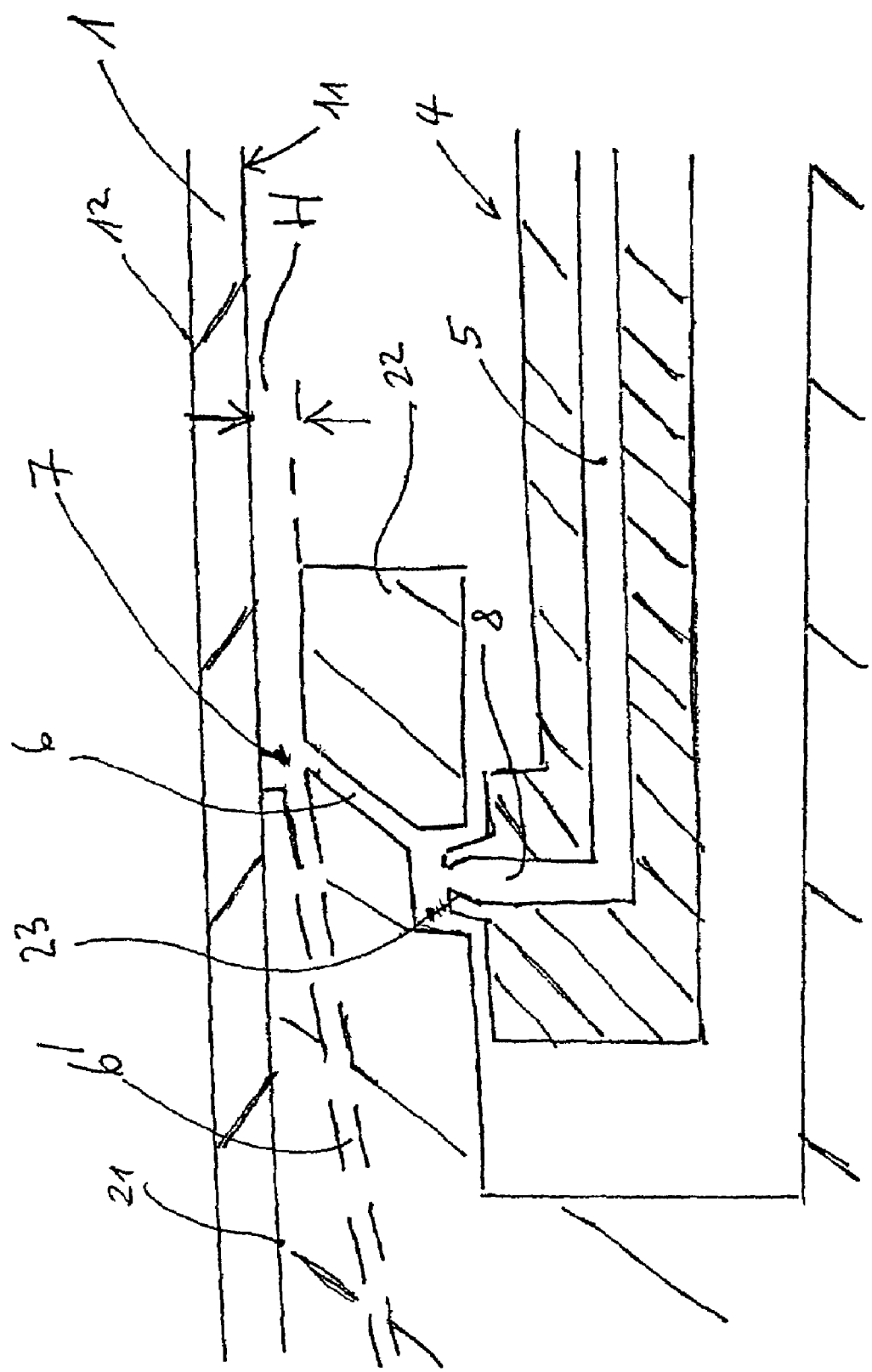

In the following, the invention will be described in more detail on the basis of a working example and with reference to the drawings in which FIG. 1 shows a schematic cross-sectional sketch of a rotatable and heatable chuck according to the invention, FIG. 2 shows an enlarged section B of FIG. 1, and FIGS. 3(a) to (c) show a schematic cross-sectional sketch of an alternative embodiment of a chuck according to the invention.

According to FIG. 1, a device according to the invention comprises a supporting means 2, e.g. a chuck, for placing and holding a substrate 1 on a supporting surface 21. The supporting means 2 can be heated by means of a heater 3 for heating in order to heat the substrate 1 resting thereon. For the heating process, the heater 3 is in contact with the supporting means 2. The supporting means 2 can be rotated around an axis A; this can be done, e.g., by a motor (not shown) which causes the means 2 to rotate without also rotating the heater 3. To this end, the means 2 is separated from the heater 3, as shown in FIG. 1, in that the means 2 is moved slightly upwardly or the heater 3 downwardly so that a gap S is formed between the two means 2 and 3.

By means of a fluid supply means 4, a fluid, i.e. a gas or a liquid, e.g. a solvent, is introduced or injected into this groove 23 through a pipeline 5 and a nozzle 8 projecting into an annular groove 23 being coaxial with respect to the axis A. This annular groove 23 is formed in a back side of the supporting means 2, i.e. opposite to the supporting surface 21. Bores 6 leading to openings 7 in a portion 22 that is lower than the supporting surface 21 extend from this annular groove 23. The fluid, e.g. a solvent, is supplied through the bores 6 and openings 7 onto the side 11 of the substrate 1 facing the supporting surface 21, as far as this side 11 projects radially outwardly from the supporting surface 21. By rotating the supporting means 2 and thus by rotating the substrate 1, the fluid, e.g. the solvent, is supplied to the radially outer edge of the surface 11 of the substrate 1 and can thus also clean the edge region of the substrate 1. Preferably, the supporting means 2 is configured such that the parts of the fluid which are injected through the nozzle into the annular groove 23 but do not reach the substrate surface 11 through the bores but drop downwardly cannot reach the heater 3.

Instead of being supplied through an annular groove 23, the fluid can, e.g., also be supplied through a pipeline 5' in an axial bore of the heater 3 into the interior of the supporting means 2 and from there through essentially radial bores 6' to the openings 7 in the edge step 22, as shown in dashed lines in FIGS. 1 and 2. Alternatively, the fluid supply means can also be configured as an external spray head 4', as shown in FIG. 3(c) which will be described in more detail below. This spray head can be movable and, for instance, only if necessary moved below the substrate. A movable spray head can be passed across the side of the substrate facing the supporting surface so that the fluid is applied uniformly.

FIGS. 3(a) to (c) schematically show an alternative embodiment of a rotatable chuck according to the invention. The embodiment shown in FIGS. 3(a) to (c) is a two-part chuck which, in addition to a central part 2 of the supporting means, comprises an edge region 24. During spray coating, the two-part chuck is used in the lowered state as shown in FIG. 3(a). The substrate is sucked onto the chuck by means of a vacuum connection 8, as described above. In this state, the central region 2 is flush with the edge region so that in the lowered state the substrate 1 has full-surface contact with the supporting means 2 and 24. Hence, the side of the substrate facing the supporting means is essentially covered completely, and thus the risk that this side becomes dirty or contaminated by the substance to be applied is avoided to a large extent. However, since contamination cannot be avoided completely, the central region of the chuck is lifted after the spraying operation. This leads to the formation of a clearance between the upper side of the edge region 24 of the chuck and the lower side of the substrate 1, as shown in FIG. 3(b). In this state, too, the substrate remains sucked by the vacuum connection 8. By means of a fluid supply means, as described above, a fluid can be applied to the now exposed lower side 11 of the substrate 1. FIG. 3(c) exemplarily shows a spray head 4'. However, also in this alternative embodiment the above-mentioned channels for supplying the fluid can be provided. Also in this embodiment it is possible to heat the chuck. As required, either only the central part 2 or both the central part 2 and the edge region 24 of the chuck can be heatable.

Moreover, the disclosed embodiments also claim a combination without fluid supply arrangement and comprising the above-mentioned rotating means in combination with the above-mentioned heater, wherein the supporting means is separated from the heater for rotation.

The invention claimed is:

1. A device for holding and rotating a flat substrate (1), in particular for treating the exposed surface of the substrate by spray coating, comprising
a supporting means (2) which can be rotated around an axis (A) and serves for placing and holding the substrate (1) on a supporting surface (21) extending perpendicularly with respect to the axis (A), wherein the diameter of the supporting surface (21) is smaller than that of the substrate,
a rotating means for rotating the supporting means (2),
a fluid supply arrangement (4) for supplying a fluid onto the part of the side (11) of the substrate (1) facing the supporting surface (21) and radially projecting outwardly from the supporting surface (21), and
a heating means (3) for heating the supporting means (2), wherein the heating means (3) and the supporting means (2) are arranged coaxially.

2. The device according to claim 1, wherein the fluid supply arrangement can be activated during the rotation of the supporting means (2).

3. The device according to claim 1, wherein the heating means (3) can be brought in contact with the supporting means (2) if the supporting means (2) is not rotated.

4. The device according to claim 1, wherein the fluid supply arrangement (4) comprises, in the side of the supporting means (2) facing away from the supporting surface (21), an annular groove (23) which is coaxial with respect to the axis (A), serves for introducing fluid through a supply line (5) and communicates with openings (7) in the supporting surface (21) through essentially radial bores (6).

5. The device according to claim 4, wherein an edge (22) that is stepped relative to the supporting surface (21) is provided at the circumference of the supporting surface (21) and the openings (7) are formed in the region of the edge step.

6. The device according to claim 1, wherein the fluid supply arrangement is realized as a movable spray head (4').

7. The device according to claim 5, wherein the height (H) of the edge step is approximately 0.2 mm.

8. The device according to claim 5, wherein the width of the stepped edge (22) is approximately 3 mm to 10 mm, preferably 5 mm in the radial direction.

9. The device according to claim 1, wherein the heating means (3) comprises a resistance heater.

10. The device according to claim 1, wherein the supporting means (2) is made of a metal, preferably aluminum.

11. The device according to claim 1, wherein the radius of the supporting surface (21) is approximately 100 mm to approximately 200 mm.

12. The device according to claim 1, wherein the device further comprises an edge region (24) which is coaxial with respect to the supporting means (2) and which is axially movable relative to the supporting means between a first position in which the sides of the edge region (24) and of the supporting means (2) facing the substrate are flush (FIG. 3(*a*)) and a second position in which the side of the edge region (24) facing the substrate is spaced from the substrate (FIGS. 3(*b*) and 3(*c*)).

13. A device for holding and rotating a flat substrate (1), in particular for treating the exposed surface of the substrate by spray coating, comprising
   a supporting means (2) which can be rotated around an axis (A) and serves for placing and holding the substrate (1) on a supporting surface (21) extending perpendicularly with respect to the axis (A), wherein the diameter of the supporting surface (21) is smaller than that of the substrate,
   a rotating means for rotating the supporting means (2),
   a fluid supply arrangement (4) for supplying a fluid onto the part of the side (11) of the substrate (1) facing the supporting surface (21) and radially projecting outwardly from the supporting surface (21), and
   wherein the fluid supply arrangement (4) comprises, in the side of the supporting means (2) facing away from the supporting surface (21), an annular groove (23) which is coaxial with respect to the axis (A), serves for introducing fluid through a supply line (5) and communicates with openings (7) in the supporting surface (21) through essentially radial bores (6).

14. The device according to claim 13 comprising a means (3) for heating the supporting means (2).

15. A device for holding and rotating a flat substrate (1), in particular for treating the exposed surface of the substrate by spray coating, comprising
   a supporting means (2) which can be rotated around an axis (A) and serves for placing and holding the substrate (1) on a supporting surface (21) extending perpendicularly with respect to the axis (A), wherein the diameter of the supporting surface (21) is smaller than that of the substrate,
   a rotating means for rotating the supporting means (2),
   a fluid supply arrangement (4) for supplying a fluid onto the part of the side (11) of the substrate (1) facing the supporting surface (21) and radially projecting outwardly from the supporting surface (21),
   a heating means (3) for heating the supporting means (2), and
   wherein the heating means (3) comprises a resistance heater.

16. The device according to claim 15, wherein the heating means (3) and the supporting means (2) are arranged coaxially.

17. The device according to claim 16, wherein the heating means (3) is axially movable for heating the supporting means (2) via the contact surface.

18. A device for holding and rotating a flat substrate (1), in particular for treating the exposed surface of the substrate by spray coating, comprising
   a supporting means (2) which can be rotated around an axis (A) and serves for placing and holding the substrate (1) on a supporting surface (21) extending perpendicularly with respect to the axis (A), wherein the diameter of the supporting surface (21) is smaller than that of the substrate,
   a rotating means for rotating the supporting means (2),
   a fluid supply arrangement (4) for supplying a fluid onto the part of the side (11) of the substrate (1) facing the supporting surface (21) and radially projecting outwardly from the supporting surface (21), and
   wherein the device further comprises an edge region (24) which is coaxial with respect to the supporting means (2) and which is axially movable relative to the supporting means between a first position in which the sides of the edge region (24) and of the supporting means (2) facing the substrate are flush (FIG. 3(*a*)) and a second position in which the side of the edge region (24) facing the substrate is spaced from the substrate (FIGS. 3(*b*) and 3(*c*)).

* * * * *